(12) United States Patent
Jung et al.

(10) Patent No.: US 10,721,820 B2
(45) Date of Patent: Jul. 21, 2020

(54) DISPLAY DEVICE

(71) Applicant: Samsung Display Co., Ltd., Yongin-Si, Gyeonggi-Do (KR)

(72) Inventors: Sangwoon Jung, Seongnam-si (KR); Mansoo Kim, Asan-si (KR); Joon-ik Lee, Incheon (KR); Changmoo Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 130 days.

(21) Appl. No.: 15/244,119

(22) Filed: Aug. 23, 2016

(65) Prior Publication Data

US 2017/0099736 A1  Apr. 6, 2017

(30) Foreign Application Priority Data

Oct. 2, 2015 (KR) .................. 10-2015-0139208

(51) Int. Cl.
| | |
|---|---|
| *H05K 1/14* | (2006.01) |
| *H05K 1/02* | (2006.01) |
| *H05K 7/18* | (2006.01) |
| *H05K 7/20* | (2006.01) |

(Continued)

(52) U.S. Cl.
CPC .......... *H05K 1/147* (2013.01); *G02F 1/13452* (2013.01); *H05K 1/028* (2013.01); *H05K 7/18* (2013.01); *H05K 7/20963* (2013.01); *G02F 2001/13456* (2013.01); *H05K 1/0203* (2013.01);
(Continued)

(58) Field of Classification Search
CPC ........ G06F 1/1601–1611; G06F 1/1613–1698; G06F 1/18–189; G06F 1/181–182; H05K 5/00–069; H05K 7/00–186; H05K 7/20218–20381; H05K 7/20409–20418; H05K 7/20009–202; H05K 1/147; H05K 1/028; H05K 7/18; H05K 7/20963; H05K 1/0203; H05K 1/189; H05K 2201/09145; H01L 23/367–3677; H01L 23/473;
(Continued)

(56) References Cited

U.S. PATENT DOCUMENTS

| | | | | |
|---|---|---|---|---|
| 7,453,532 | B2 * | 11/2008 | Kondo | ................ G02F 1/13452 349/149 |
| 9,477,124 | B2 * | 10/2016 | Wada | ................ G02F 1/133308 |
| 9,632,233 | B2 * | 4/2017 | Hosoki | ............... G02F 1/13452 |

(Continued)

FOREIGN PATENT DOCUMENTS

KR   1020060021559 A   3/2006

*Primary Examiner* — Jayprakash N Gandhi
*Assistant Examiner* — Razmeen Gafur
(74) *Attorney, Agent, or Firm* — Cantor Colburn LLP

(57) ABSTRACT

A display device includes: a display panel which displays an image with light and a drive unit which is electrically connected to the display panel and drives the display panel. The drive unit includes a drive circuit board and a drive circuit film. The drive circuit board overlaps the display panel, generates a drive signal to drive the display panel and defines a receiving hole therein. The drive circuit film electrically connects the display panel to the drive circuit board and is bent from the display panel toward the drive circuit board. The drive circuit film includes a driver chip which provides a control signal in response to the drive signal from the drive circuit board. The driver chip is received in the receiving hole defined in the drive circuit board.

19 Claims, 7 Drawing Sheets

(51) Int. Cl.
*H05K 1/18* (2006.01)
*G02F 1/1345* (2006.01)

(52) U.S. Cl.
CPC ... *H05K 1/189* (2013.01); *H05K 2201/09145* (2013.01)

(58) Field of Classification Search
CPC ......... H01L 23/46–467; G02F 1/13452; G02F 2001/13456
USPC ............. 361/679.01–679.45, 679.55–679.61, 361/724–727, 679.26–679.3, 361/679.31–679.39, 676–678, 361/679.46–679.54, 688–723, 756, 741, 361/686, 687, 787, 789, 794, 807–810; 455/575.1–575.9; 349/56–60; 312/223.1–223.3; 348/787, 789, 794
See application file for complete search history.

(56) References Cited

U.S. PATENT DOCUMENTS

| | | | | |
|---|---|---|---|---|
| 9,942,978 | B2* | 4/2018 | Lee | H05K 1/028 |
| 2001/0003471 | A1* | 6/2001 | Lee | G02F 1/133308 |
| | | | | 349/58 |
| 2005/0194913 | A1* | 9/2005 | Kim | H05K 5/02 |
| | | | | 315/169.4 |
| 2006/0077129 | A1* | 4/2006 | Kim | H05K 5/02 |
| | | | | 345/60 |
| 2006/0133018 | A1* | 6/2006 | Okuda | G02F 1/133308 |
| | | | | 361/679.26 |
| 2006/0268511 | A1* | 11/2006 | Jeong | H05K 7/20963 |
| | | | | 361/690 |
| 2007/0018577 | A1* | 1/2007 | Hwang | H05K 5/0247 |
| | | | | 313/582 |
| 2007/0171346 | A1* | 7/2007 | Chang | G02B 6/0083 |
| | | | | 349/150 |
| 2008/0089018 | A1* | 4/2008 | Kim | G02F 1/133308 |
| | | | | 361/679.01 |
| 2008/0158470 | A1* | 7/2008 | Chung | G02F 1/13452 |
| | | | | 349/58 |
| 2008/0232047 | A1* | 9/2008 | Yamada | G02F 1/13452 |
| | | | | 361/679.02 |
| 2009/0167171 | A1* | 7/2009 | Jung | H01L 51/5237 |
| | | | | 313/504 |
| 2009/0168318 | A1* | 7/2009 | Moon | H01L 51/5237 |
| | | | | 361/679.21 |
| 2009/0168357 | A1* | 7/2009 | Suzuki | H05K 5/02 |
| | | | | 361/709 |
| 2009/0213534 | A1* | 8/2009 | Sakai | G02F 1/13452 |
| | | | | 361/679.21 |
| 2009/0290327 | A1* | 11/2009 | Kim | G02F 1/133604 |
| | | | | 362/97.1 |
| 2011/0211139 | A1* | 9/2011 | Itoh | G02F 1/13452 |
| | | | | 349/60 |
| 2011/0296671 | A1* | 12/2011 | Sung | G06F 1/1601 |
| | | | | 29/592.1 |
| 2012/0182493 | A1* | 7/2012 | Hwang | G02F 1/133308 |
| | | | | 349/58 |
| 2013/0182379 | A1* | 7/2013 | Kim | H04M 1/0283 |
| | | | | 361/679.01 |
| 2013/0258565 | A1* | 10/2013 | Nishi | H05K 7/14 |
| | | | | 361/679.01 |
| 2013/0286319 | A1 | 10/2013 | Kuo et al. | |
| 2014/0022715 | A1* | 1/2014 | Kim | H05K 5/0017 |
| | | | | 361/679.01 |
| 2014/0118902 | A1* | 5/2014 | Kim | G02F 1/133308 |
| | | | | 361/679.01 |
| 2014/0139992 | A1* | 5/2014 | Yang | G06F 1/1637 |
| | | | | 361/679.21 |
| 2014/0169033 | A1* | 6/2014 | Yu | H05K 7/20409 |
| | | | | 362/611 |
| 2014/0177147 | A1* | 6/2014 | Teramoto | H05K 13/00 |
| | | | | 361/679.01 |
| 2014/0232945 | A1* | 8/2014 | Uno | G02F 1/133615 |
| | | | | 348/739 |
| 2014/0307396 | A1* | 10/2014 | Lee | H05K 1/028 |
| | | | | 361/749 |
| 2014/0313746 | A1* | 10/2014 | Song | G06F 1/1637 |
| | | | | 362/362 |
| 2015/0062466 | A1* | 3/2015 | Yun | G06F 1/1601 |
| | | | | 349/12 |
| 2015/0062927 | A1* | 3/2015 | Hirakata | H01L 51/0097 |
| | | | | 362/362 |
| 2015/0085430 | A1* | 3/2015 | Lee | G06F 1/16 |
| | | | | 361/679.01 |
| 2015/0131014 | A1 | 5/2015 | Yanagawa et al. | |
| 2015/0131024 | A1* | 5/2015 | Sakamoto | G02F 1/1345 |
| | | | | 349/58 |
| 2015/0153607 | A1 | 6/2015 | Chen et al. | |
| 2016/0029503 | A1* | 1/2016 | Shedletsky | H05K 1/147 |
| | | | | 361/679.02 |
| 2017/0192285 | A1* | 7/2017 | Shibahara | G02F 1/1333 |
| 2018/0006250 | A1* | 1/2018 | Saeki | H05K 999/99 |
| 2018/0199426 | A1* | 7/2018 | Lee | H05K 1/028 |
| 2018/0252859 | A1* | 9/2018 | Yamamoto | H05K 9/00 |

* cited by examiner

DISPLAY DEVICE

This application claims priority to Korean Patent Application No. 10-2015-0139208, filed on Oct. 2, 2015, and all the benefits accruing therefrom under 35 U.S.C. § 119, the content of which in its entirety is hereby incorporated by reference.

BACKGROUND (1) Field

The invention relates to a display device, and more particularly, to a display device including a display panel to which a drive circuit film and a drive circuit board are electrically connected.

(2) Description of the Related Art

A display device includes a display panel, a drive circuit board generating a driving signal which drives the display panel, and a drive circuit film connecting the display panel to the drive circuit board. In general, the drive circuit board has a form of a printed circuit board ("PCB") and the drive circuit film may have a form of a flexible printed circuit ("FPC").

The drive circuit board includes a connector connected to a power cable and a plurality of circuit components generating the driving signal which drives the display panel. In addition, the drive circuit film electrically connects the drive circuit board to the display panel. A driver chip is mounted on the drive circuit film and outputs an image control signal such as a gate signal and a data signal to a pixel of the display panel in response to the driving signal from the drive circuit board.

SUMMARY

One or more exemplary embodiment of the invention provides a display device with improved reliability in an operation of displaying an image.

An exemplary embodiment of the invention provides a display device including a display panel which displays an image and a drive unit which is electrically connected to the display panel and drives the display panel.

The drive unit includes a drive circuit board and a drive circuit film. The drive circuit board overlaps the display panel and generates a drive signal to drive the display panel. The drive circuit board defines a receiving hole therein. The drive circuit film electrically connects the display panel to the drive circuit board and is bent from the display panel toward the drive circuit board. The drive circuit film includes a driver chip which provides a control signal in response to the drive signal from the drive circuit board. The driver chip of the drive circuit film is received in the receiving hole defined in the drive circuit board.

In an exemplary embodiment, the drive circuit board may defines a base portion thereof and a dummy portion thereof which extends from a side portion of the base portion and defines the receiving hole of the drive circuit board. The drive circuit film extended from the display panel toward the drive circuit board may extend through the receiving hole defined by the dummy portion.

In an exemplary embodiment, the display panel may include a pad portion at which the drive circuit film is electrically connected to the display panel, and the dummy portion may overlap the pad portion in a top plan view.

In an exemplary embodiment, the dummy portion may be provided in plurality and the plurality of the dummy portions may be arranged in a length direction of the pad portion in the top plan view.

In an exemplary embodiment, a side of the dummy portion of the drive circuit board may be open in a direction facing the drive circuit film to expose the receiving hole to the drive circuit film.

In an exemplary embodiment, the display device may further include a heat dissipation member disposed on the driver chip received in the receiving hole and contacting the driver chip. In addition, the receiving hole may be defined through an entire thickness of the base portion of the drive circuit board, and the heat dissipation member in contact with the driver chip received in the receiving hole may face the bottom portion of the receiving member with an air layer in-between.

In an exemplary embodiment, the display device may further include a buffer member which is disposed the bottom portion of the receiving member and adjacent to the driver chip received in the receiving hole. The buffer member may extend from the bottom portion of the receiving member further than the driver chip.

In another exemplary embodiment of the invention, a display device includes a display device including a display panel which displays an image with light, a drive unit which is electrically connected to the display panel and drives the display panel, and a receiving member which receives the display panel therein.

The drive unit includes a drive circuit board, a drive circuit film and a driver chip. The drive circuit board generates a drive signal to drive the display panel and is disposed on a back surface of the receiving member. The drive circuit film electrically connects the display panel to the drive circuit board and is bent from the display panel toward the drive circuit board. The drive circuit film includes a driver chip which provides a control signal in response to the drive signal from the drive circuit board.

The receiving member includes a bottom portion which defines the back surface of the receiving member on which the drive circuit board is disposed and defines a bent portion which covers the driver chip of the drive circuit film, and a side wall extending from the bottom portion.

In an exemplary embodiment, the bent portion may define a first portion thereof in parallel with the bottom portion, and a second portion thereof provided in plurality respectively extended from ends of the first portion to define a stepped portion. A height of the stepped portion defined by the first and second portions is greater than a thickness of the driver chip covered by the bent portion, in a cross-sectional view.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
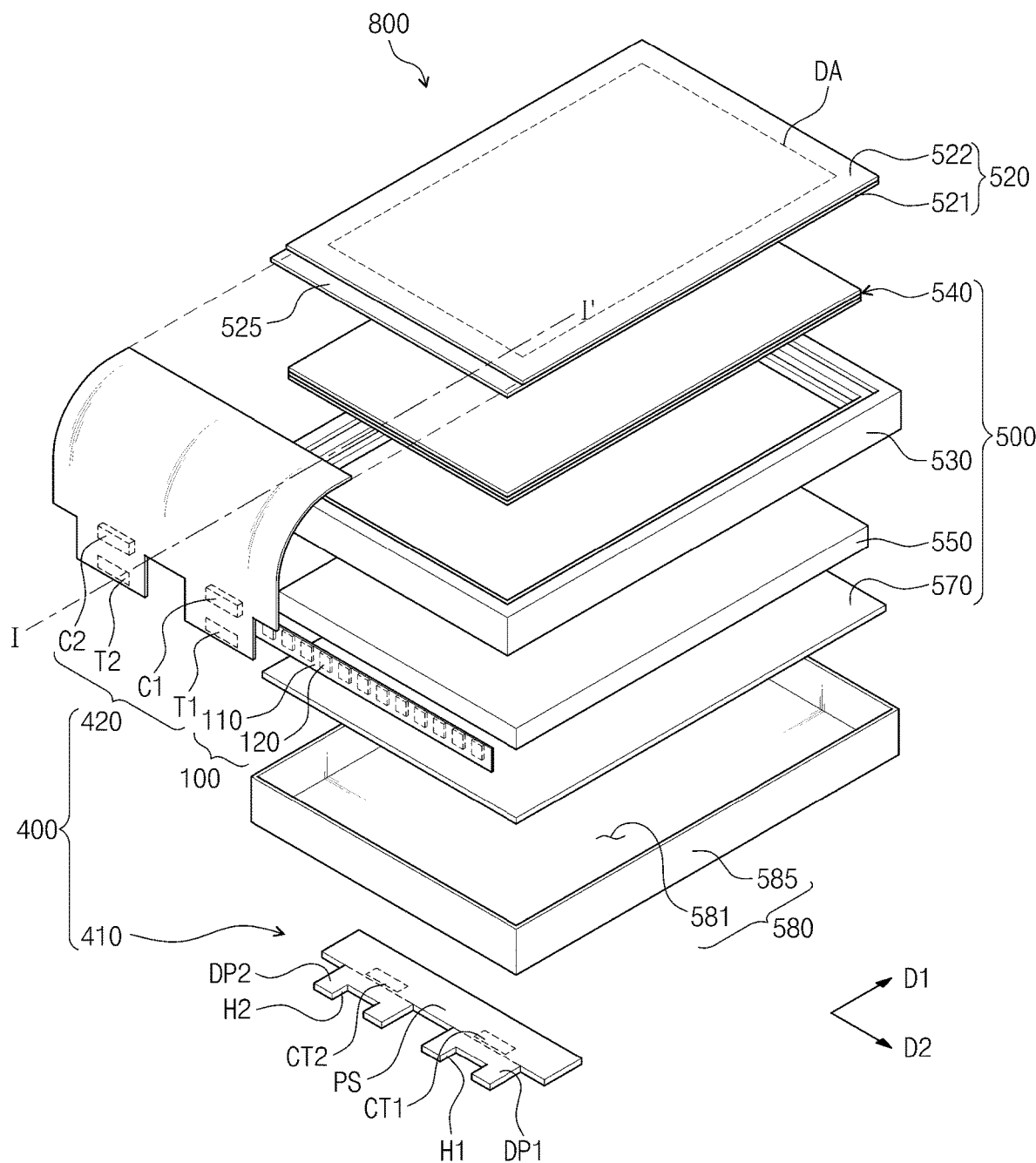
FIG. 1 illustrates an exploded perspective view of an exemplary embodiment of a display device according to the invention.

Hereinafter, exemplary embodiments of the invention will be described in detail with reference to the attached drawings. The objects, features, and effects of the invention will be readily understood through embodiments related to the accompanying drawings. The present disclosure may, however, be embodied in various forms and should not be construed as limited to the embodiments set forth herein. Rather, these embodiments are provided so that this disclosure will be thorough and complete, and will fully convey the scope of the present disclosure to those skilled in the art. Therefore, the scope of the present disclosure should not be construed as being limited to the embodiments set forth herein. Reference numerals are used for referring to the same or similar elements in the description and drawings.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 illustrates an exploded perspective view of an exemplary embodiment of a display device according to the invention.

Referring to FIG. 1, in this exemplary embodiment, a display device 800 may be a liquid crystal display device. The display device 800 includes a display panel 520, a receiving member 580, a backlight unit 500 and a drive unit 400.

The display panel 520 includes a display region DA and receives light emitted from the backlight unit 500 to display an image through the display region DA. The display panel 520 includes a first display substrate 521, a second display substrate 522, a pad portion 525, and a liquid crystal layer (not shown) between the first and second display substrates 521 and 522. The first display substrate 521 includes a plurality of pixels and a plurality of thin film transistors, and the second display substrate 522 includes a common electrode facing the plurality of pixel electrodes of the first display substrate 521.

In this exemplary embodiment, the display panel 520 may be, but not limited to, a liquid crystal display panel. In another exemplary embodiment, for example, the display panel 520 may be an organic electroluminescent display panel. Where the display panel 520 is the organic electroluminescent display panel, since the organic electroluminescent display panel self-generates light to display an image, the backlight unit 500 may be omitted in the display device 800.

In this exemplary embodiment, the pad portion 525 may be defined as a portion of the first display substrate 521 at which a plurality of pads connected to the thin film transistors of the display panel 520 are disposed. In addition, the pad portion 525 is bonded to terminals of a drive circuit film 420, so that the display panel 520 may be electrically connected to the drive circuit film 420.

The receiving member 580 is provided with a bottom portion 581 and a side wall 585 provided in plurality extending from the bottom portion 581. The receiving member 580 defines a receiving space in which the display panel 520 and the backlight unit 500 are received.

The backlight unit 500 includes a light emitting unit 100, a reflection plate 570, a light guide plate 550, a mold frame 530 and optical sheets 540.

The light emitting unit 100 generates light. In this exemplary embodiment, the light emitting unit 100 includes a printed circuit board 110 and a light emitting diode package 120 provided in plurality mounted on the printed circuit board 110 to emit the light. The printed circuit board 110 may extend lengthwise along one side of the light guide plate 550 and the plurality of light emitting diode packages 120 may be arranged along a longitudinal (e.g., length) direction of the printed circuit board 110. Light emitted from the plurality of light emitting diode packages 120 may be incident toward the light guide plate 550 through an entrance surface defined at the one side of the light guide plate 550.

In another exemplary embodiment, the light emitting unit 100 may be provided in plurality and the plurality of light emitting units 100 may be located in one-to-one correspondence to the side surfaces of the light guide plate to define multiple light entrance surfaces of the light guide plate 550.

The light guide plate 550 receives light generated from the light emitting unit 100 and guides the received light toward the display panel 520. In more detail, the light is incident toward the light guide plate 550 as described above, and then a path of the incident light is changed by light emitting patterns (not shown), disposed on a back surface of the light guide plate 550, with a concave and convex shape, so that the incident light may be emitted from the light guide plate 550 toward the display panel 520 through an emitting surface (555 in FIG. 3) of the light guide plate 550.

The mold frame 530 is coupled with the receiving member 580 to support edges of the light guide plate 550 on the receiving member 580. The mold frame 530 may have stepped portions having a stepped shape defined thereinside, and the optical sheets 540 and the display panel 520 may be disposed on the stepped portions of the mold frame 530.

The optical sheets 540 are disposed between the display panel 520 and the light guide plate 550. The optical sheets 540 may adjust a light path emitted from the light guide plate 550 and incident toward the display panel 520. In this exemplary embodiment, the optical sheets 540 may include a diffusion sheet 543 diffusing light emitted from the light guide plate 550, a prism sheet 542 condensing the light emitted from the light guide plate 550 and a protection sheet 541 protecting the prism sheet 542.

The reflection plate 570 is disposed on the bottom portion 581 of the receiving member 580 between the bottom portion 581 and the light guide plate 550. The reflection plate 570 reflects leakage light leaked through a back surface of the light guide plate 550 and accordingly the leaked light may be re-incident on the light guide plate 550 by the reflection plate 570.

The drive unit 400 is electrically connected to the display panel 520 to drive the display panel 520. In this exemplary embodiment, the drive unit 400 includes a drive circuit board 410, the drive circuit film 420, a first driver chip C1 and a second driver chip C2.

The drive circuit board 410 overlaps the display panel 520 and is electrically connected to the display panel 520. In this exemplary embodiment, the drive circuit board 410 is disposed on a back surface of the receiving member 580 and may face the display panel 520 with the bottom portion 581 of the receiving member 580 in-between The drive circuit board 410 generates a driving signal which drives the display panel 520. In this exemplary embodiment, circuit components such as a connector and a timing controller (not shown) which are electrically connected to an inverter (not shown) may be mounted on the drive circuit board 410.

In this exemplary embodiment, the drive circuit board 410 may have a shape of a plate like a printed circuit board ("PCB"). The drive circuit board 410 may include a base portion PS, a first connection portion CT1, a second connection portion CT2, a first dummy portion DP1 and a second dummy portion DP2.

The base portion PS has a shape of a plate and may include printed wires each including or being formed of a metal wire. The first and second connection portions CT1 and CT2 are disposed on the base portion PS in one-to one correspondence to first and second terminal units T1 and T2, thus being electrically connected to the first and second terminal units T1 and T2, respectively. In this exemplary embodiment, each of the first and second connection portions CT1 and CT2 may include a connector. In another exemplary embodiment, each of the first and second connection portions CT1 and CT2 may include a bonding pad.

The first and second dummy portions DP1 and DP2 are coupled to one side of the base portion PS to be disposed in parallel with the base portion PS. In this exemplary embodiment, the first and second dummy portions DP1 and DP2 may be integrated with the base portion PS.

In this exemplary embodiment, each position of the first and second dummy portions DP1 and DP2 may correspond to that of the pad portion 525 of the display panel 520. In an exemplary embodiment, for example, when the display panel 520 has two long sides extended lengthwise in a first direction D1 and two short sides extended lengthwise in a second direction D2 perpendicular to the first direction D1 in the top plan (planar) view, and the pad portion 525 is located at one of the short sides, each of the positions of the first and second dummy portions DP1 and DP2 may correspond to the one short side among the two long sides and the two short sides in the top plan view.

In addition, since the drive circuit film 420 is electrically connected to the drive circuit board 410 via the first and second dummy portions DP1 and DP2, the first and second dummy portions DP1 and DP2 may be arranged in the second direction D2, that is, a longitudinal direction of the pad portion 525 in the top plan view.

In this exemplary embodiment, a first receiving hole H1 may be defined in or by the first dummy portion DP1 and a second receiving hole H2 may be defined in or by the second dummy portion DP2. The first and second receiving holes H1 and H2 respectively receive the first and a second driver chips C1 and C2 mounted on the drive circuit film 420. Therefore, the structures of the first and second receiving holes H1 and H2 may reduce or effectively prevent damage to the first and second driver chips C1 and C2 directly connected to peripheral components. This is described in more detail with reference to FIGS. 2 and 3.

The drive circuit film 420 electrically connects the display panel 520 to the drive circuit board 410. In addition, the drive circuit film 420 is shaped to be bent from the pad portion 525 of the display panel 520 toward the drive circuit board 410. In this exemplary embodiment, the drive circuit film 420 may have a shape of a flexible printed circuit ("FPC").

The drive circuit film 420 includes the first and second terminal units T1 and T2 at a distal end of the drive circuit film 420, and the first and second driver chips C1 and C2 thereon. The first and second terminal units T1 and T2 are electrically connected to the first and second connection portions CT1 and CT2 of the drive circuit board 410, respectively.

In this exemplary embodiment, the first and second driver chips C1 and C2 are mounted on the drive circuit film 420 in a chip on film ("COF") method. The first and second driver chips C1 and C2 provide a control signal such as a data signal to the first display substrate 521 in response to a drive signal generated by the drive circuit board 410.

Figure 2:
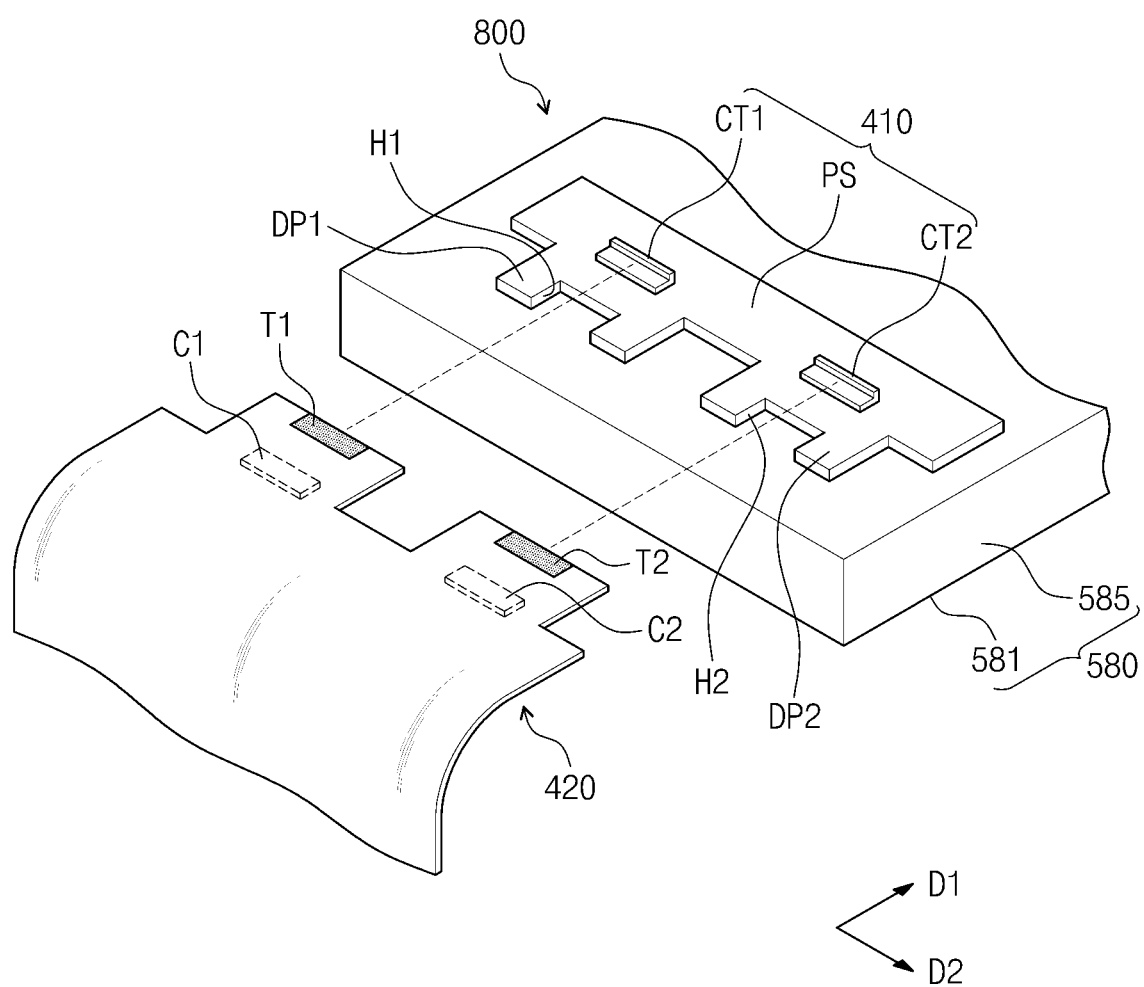
FIG. 2 illustrates a perspective view illustrating an exemplary embodiment of a back surface of the display device illustrated in FIG. 1.
Figure 3:
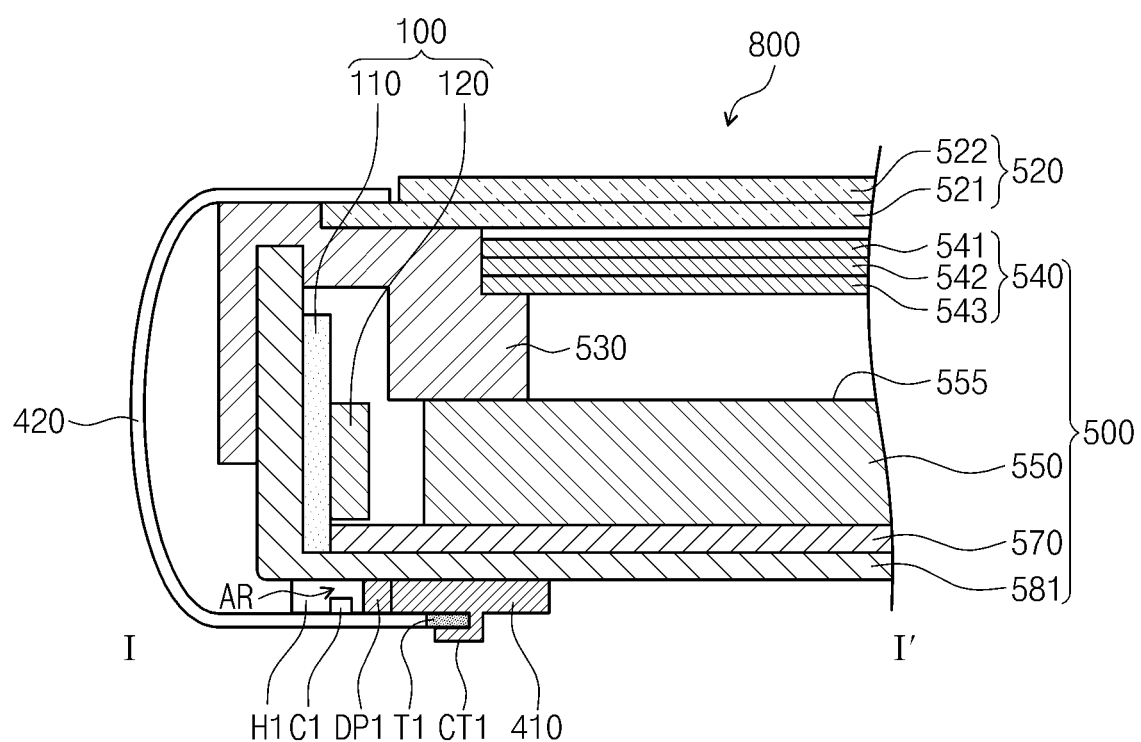
FIG. 3 illustrates a cross-sectional view of the display device taken along line I-I' illustrated in FIG. 1.

FIG. 2 illustrates a perspective view illustrating an exemplary embodiment of a back surface of the display device illustrated in FIG. 1 and FIG. 3 illustrates a cross-sectional view illustrating the display device taken along line I-I' illustrated in FIG. 1.

Referring to FIGS. 2 and 3, the drive circuit board 410 is disposed on a rear surface of the bottom portion 581 of the receiving member 580. The drive circuit film 420 is elongated bent from the display panel 420 and along the side wall 585 of the receiving member 580 to be electrically connected to the drive circuit board 410 at the rear surface of the receiving member 580. When the drive circuit film 420 is bent as described above, a portion of the drive circuit film 420 passes through the first and second dummy portions DP1 and DP2 to dispose the first and second terminal units T1 and T2 at the first and second connection portions CT1 and CT2 of the drive circuit board 410. The first and second terminal units T1 and T2 and the first and second driver chips C1 and C2 may be disposed on the portion of the drive circuit film 420 which extends into and through the first and second dummy portions DP1 and DP2.

In addition, when the drive circuit film 420 is bent in the structure described above and the first and second terminal portion T1 and T2 of the drive circuit film 420 are in one-to-one correspondence with the first and second connection portion CT1 and CT2 of the drive circuit board 410 to be coupled with the first and second connection portions CT1 and CT2 of the drive circuit board 410, the first driver chip C1 is received in the first receiving hole H1 of the dummy portion DP1 and the second driver chip C2 is received in the second receiving hole H2 of the dummy portion DP2.

In this exemplary embodiment, the first and second dummy portions DP1 and DP2 are thicker than the first and second driver chips C1 and C2 when viewed in cross section, respectively. Referring to FIG. 3, for example, a maximum thickness of the first driver chip C1 taken from a base portion of the drive circuit film 420 is smaller than minimum thickness of the first dummy portion DP1. In addition, the first and second receiving holes H1 and H2 may be shaped to penetrate an entire thickness of the drive circuit board 410. Since thicknesses of each of the first and second dummy portions DP1 and DP2 is larger than those of the first and second driver chips C1 and C2, respectively, the first and second driver chips C1 and C2 may be spaced apart from the rear surface of the bottom portion 581 of the receiving member 580 while received in the first and second receiving holes H1 and H2 in one-to-one correspondence. A distance between the rear surface of the bottom portion 581 and the surface of the drive circuit film 420 from which the first and second driver chips C1 and C2 protrude may define a space in which the first and second driver chips C1 and C2 are disposed separated from the rear surface of the bottom portion 581 of the receiving member 580.

Therefore, even when external force is applied in a direction from the display panel 520 toward the bottom portion 581 of the receiving member 580, an impact due to the external force is not directly applied to the first and second driver chips C1 and C2 disposed under the receiving member 580, and accordingly, damage by the impact to the first and second driver chips C1 and C2 may be reduced or effectively prevented.

In this exemplary embodiment, each of the first and second driver chips C1 and C2 may face the rear surface of the bottom portion 581 such as with an air layer AR in-between. Therefore, heat generated from the first and second driver chips C1 and C2 may be transferred through the air layer AR to the bottom portion 581 of the receiving member 580 and accordingly the heat may be easily released through the bottom portion 581 to outside the display device 800.

In this exemplary embodiment, one side, adjacent to the drive circuit film 420, of each of the first and second receiving holes H1 and H2 may be open, such as in a direction opposite to the first direction D1 shown in FIG. 1. Therefore, in a method of manufacturing the display device 800, when a process in which the drive circuit film 420 is electrically connected to the drive circuit board 410 is performed, the first and second driver chips C1 and C2 may be inserted into the first and second receiving holes H1 and H2 in the first direction D1 through the open first and second receiving holes H1 and H2.

Figure 4:
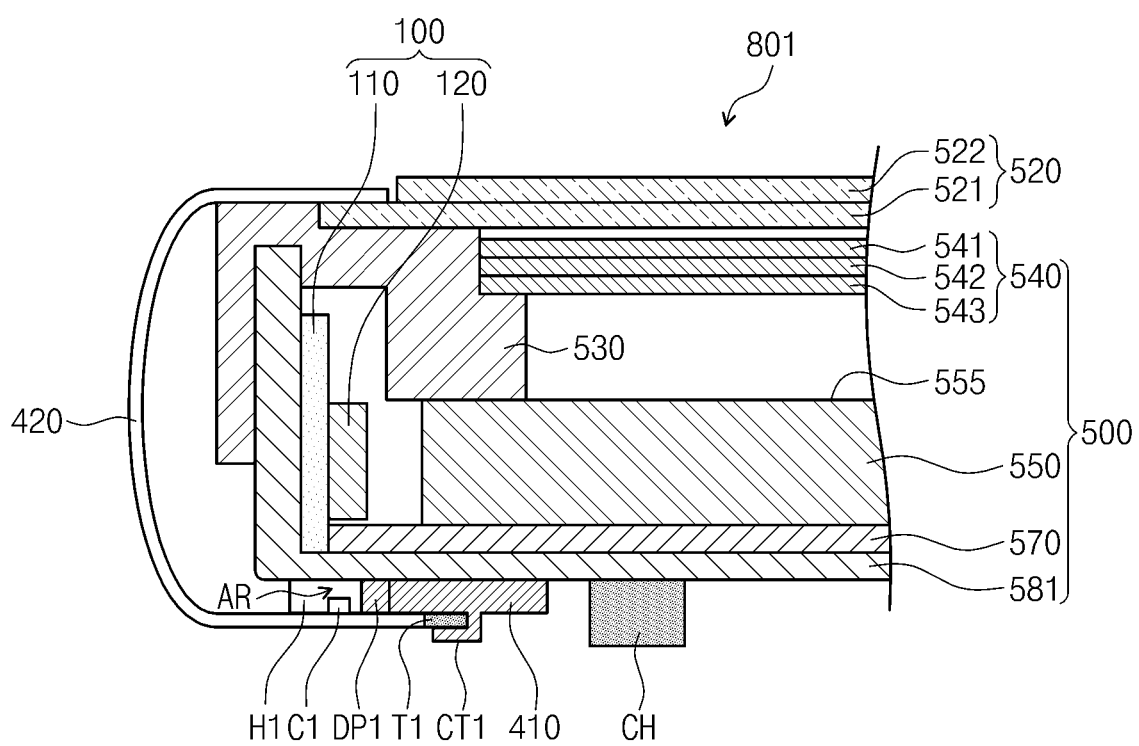
FIG. 4 illustrates a cross-sectional view of another exemplary embodiment of a display device according to the invention.

FIG. 4 illustrates a cross-sectional view of another exemplary embodiment of a display device according to the invention. In the following description of FIG. 4, the same reference numerals will be given to the same components as those described above, and duplicate description thereof will not be repeated.

Referring to FIG. 4, a display device 801 further includes a buffer member CH as a constituent element when compared to the display device (800 in FIG. 3) illustrated in FIG. 3. While a structure related to the first driver chip C1 is illustrated with reference to FIG. 4, the description thereof may be applied to the second driver chip C2 and elements related thereto.

In the exemplary embodiment of FIG. 4, the buffer member CH is disposed on the rear surface of the bottom portion 581 of the receiving member 580 and may be thicker than the first driver chip C1. Therefore, in a thickness direction, a distance from the bottom portion 581 to a distal end of the buffer member CH furthest from the bottom portion 581 may be greater than a maximum distance from the bottom portion 581 to a surface of the first driver chip C1 furthest from the bottom portion 581.

When the buffer member CH has the above-described structure, even when an impact is applied in a direction from the display panel 520 and toward the bottom portion 581 of the receiving member 580, the impact may be buffered by the buffer member CH in advance of the impact affecting the first driver chip C1.

In another exemplary embodiment, the buffer member CH may be provided in plurality and be disposed so as to surround the first driver chip C1 in the top plan view. The buffer member CH may be disposed adjacent to the first driver chip C1 on the drive circuit board 410 instead of being disposed on the rear surface of the bottom portion 581 which is exposed (e.g., non-overlapped) by the drive circuit board 410.

In the exemplary embodiment of FIG. 4, the buffer member CH may include a flexible material such as rubber. However, the invention is not limited to the described material of the buffer member CH. In another exemplary embodiment, for example, the buffer member CH may include a plastic material.

Figure 5:
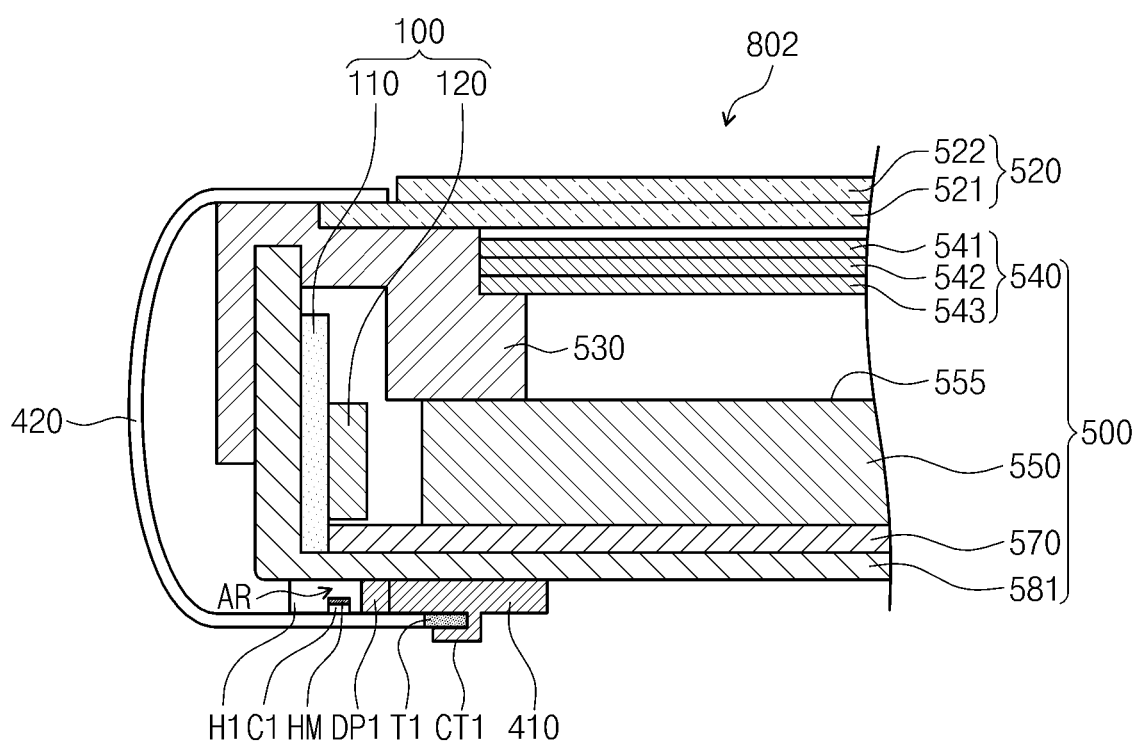
FIG. 5 illustrates a cross-sectional view of still another exemplary embodiment of a display device according to the invention.

FIG. 5 illustrates a cross-sectional view of still another exemplary embodiment of a display device according to the invention. In the following description of FIG. 5, the same reference numerals will be given to the same components as those described above and duplicate description thereof will not be repeated.

Referring to FIG. 5, a display device 802 further includes a heat dissipation member HM as a constituent element when compared to the display device (800 in FIG. 3) illustrated in FIG. 3. While a structure related to the first driver chip C1 is illustrated with reference to FIG. 5, the description thereof may be applied to the second driver chip C2 and elements related thereto.

The heat dissipation member HM is disposed on the first driver chip C1, such as at a distal end of the first driver chip C1, to contact the first driver chip C1. In addition, the heat dissipation member HM is spaced apart from the bottom portion 581 of the receiving member 580 and is exposed to the air layer AR.

In the exemplary embodiment of FIG. 5, the heat dissipation member HM may be a thermally conductive material such as in the form of a thermally conductive tape. The thermally conductive tape may include an adhesive layer and a thermally conductive metal layer which is laminated on the adhesive layer. The metal layer releases heat transferred by contact with the first driver chip C1 toward the air layer AR.

Therefore, a structure of the first receiving hole H1 of the first dummy portion DP1 which separates the first driver chip C1 from the receiving member 580 may be used to reduce or effectively prevent damage to the first driver chip C1 due to an external impact applied in a direction from the display panel 520 toward the bottom portion 581 of the receiving member 580, and the heat dissipation member HM may be used to improve an effect of releasing heat generated from the first driver chip C1 to outside the display device 802.

Figure 6:
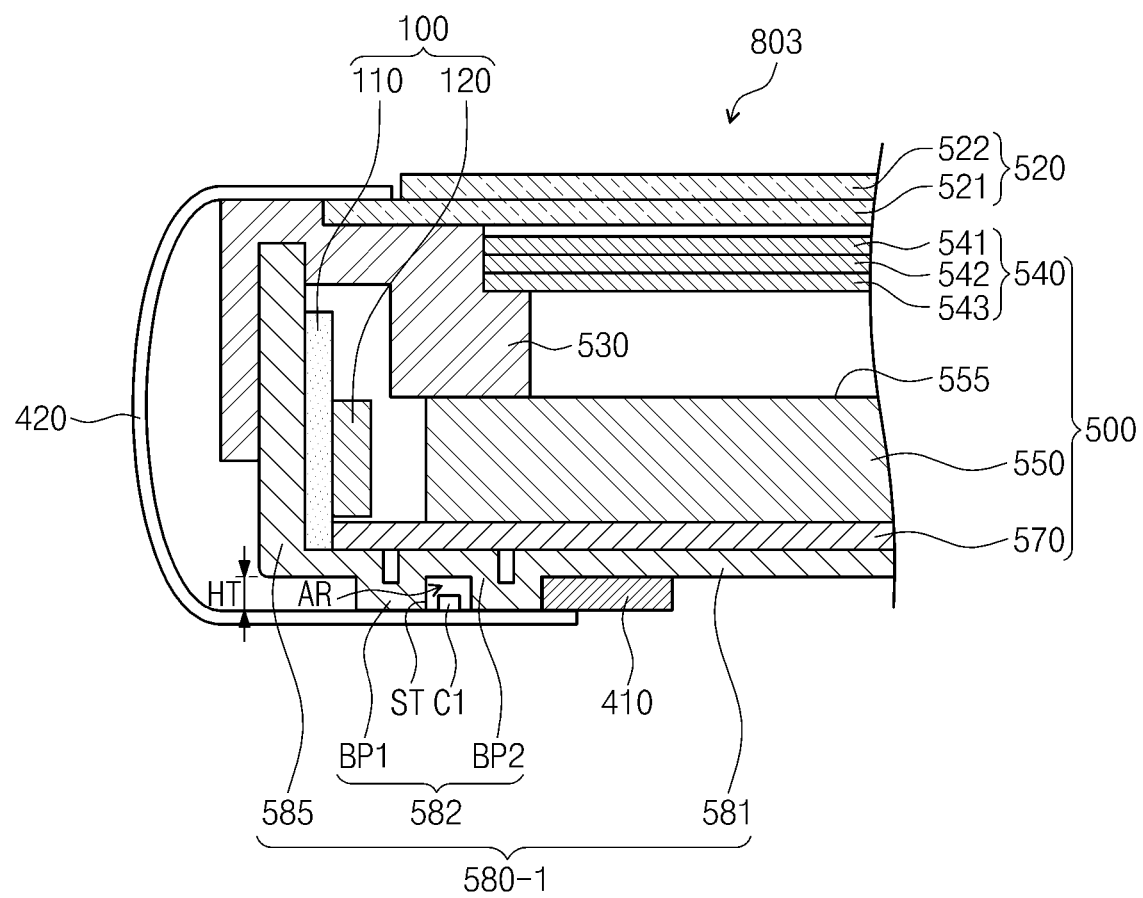
FIG. 6 illustrates a cross-sectional view of yet another exemplary embodiment of a display device according to the invention.

FIG. 6 illustrates a cross-sectional view of yet another exemplary embodiment of a display device according to the invention. In following description of FIG. 6, reference numerals will be given to the components described above and duplicate description of the components it will not be repeated. While a structure related to the first driver chip C1 is illustrated with reference to FIG. 6, the description thereof may be applied to the second driver chip C2 and elements related thereto. Although not explicitly illustrated, the first terminal unit (T1 in FIG. 1) of the drive circuit film 420 is electrically connected to the first connection portion (CT1 of FIG. 1) of the drive circuit board 410.

Referring to FIG. 6, a receiving member 580-1 of the display device 803 includes a bottom portion 581, a side wall 585 provided in plurality extending from the bottom portion 581, and a bent portion 582 connected to and defined by the bottom portion 581 to have a bent shape.

In the exemplary embodiment of FIG. 6, the bent portion 582 includes a first portion BP1 provided in plurality and a second portion BP2 provided in plurality. Each of the first portions BP1 extends in parallel with the bottom portion 581 when viewed in cross section, and each of the second portions BP2 extends in a direction perpendicular to the bottom portion 581 to be connected to an adjacent first portion BP1 among the first portions BP1.

In the exemplary embodiment of FIG. 6, a stepped portion ST may be defined by a shape of the bent portion 582 or by a shape defined by the first and second portions BP1 and BP2 connected to each other. The stepped portion ST may be open to a rear side of the display device 803. A portion of the bent portion 582 which defines the stepped portion ST covers the first driver chip C1. Therefore, even when external impact is applied in a direction from the display panel 520 toward the bottom portion 581 of the receiving member 580-1, the bent portion 582 may reduce or effectively prevent damage by the impact to the first driver chip C1.

In the exemplary embodiment of FIG. 6, a height HT of the stepped portion ST defined by the bent portion 582 is larger than a maximum thickness of the first driver chip C1 protruded from the drive circuit film 420. The height HT may be a distance between the rear surface of the bottom portion 581 at the stepped portion ST and the surface of the drive circuit film 420 from which the first driver chip C1 protrudes. Therefore, an upper surface of the first driver chip C1 may face the rear surface of the receiving member 580-1 at the bent portion 582 with the air layer AR in-between. Therefore, heat generated from the first driver chip C1 may be transferred through the air layer AR to the bent portion 582 and accordingly the heat may be easily released through the bottom portion 581 of the receiving member 580-1 to outside the display device 803.

Figure 7:
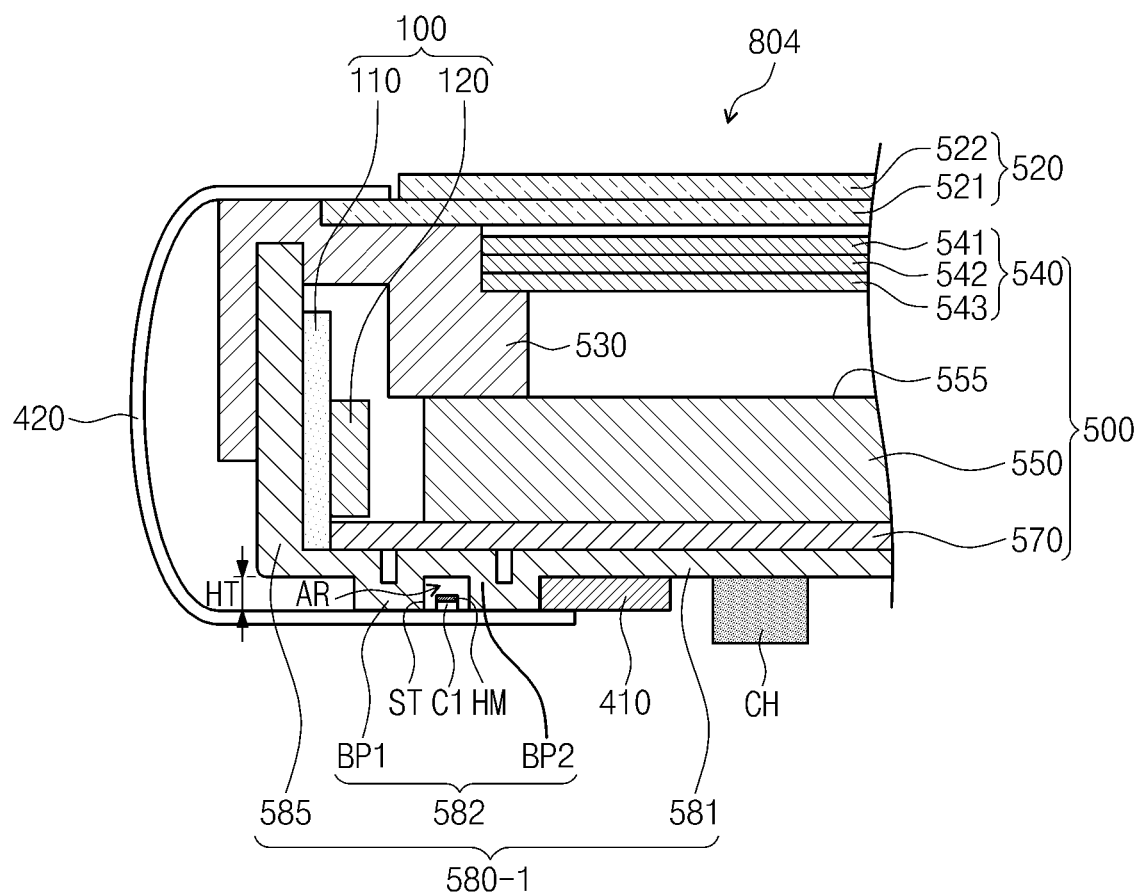
FIG. 7 illustrates a cross-sectional view of yet another exemplary embodiment of a display device according to the invention.

FIG. 7 illustrates a cross-sectional view of yet another exemplary embodiment of a display device according to the invention. In following description of FIG. 7, reference numerals will be given to the components described above and duplicate description of the components it will not be repeated. While a structure related to the first driver chip C1 is illustrated with reference to FIG. 7, the description thereof may be applied to the second driver chip C2 and elements related thereto. Although not explicitly illustrated, the first terminal unit (T1 in FIG. 1) of the drive circuit film 420 is electrically connected to the first connection portion (CT1 of FIG. 1) of the drive circuit board 410.

Referring to FIG. 7, a display device 804 further include a heat dissipation member HM as a constituent element when compared to the display device (803 in FIG. 6) illustrated in FIG. 6.

The heat dissipation member HM is disposed on the first driver chip C1 to contact the first driver chip C1. In addition, the heat dissipation member HM is spaced apart from a bent portion 582 of the receiving member 580-1 and is exposed to the air layer AR.

In the exemplary embodiment of FIG. 7, the heat dissipation member HM may be a thermally conductive tape. Accordingly, heat transferred from the first driver chip C1 to the heat dissipation member HM by contact with the first driver chip C1 may be released toward the air layer AR.

Therefore, a structure of the bent portion 582 of the receiving member 580-1 may be used to reduce or effectively prevent damage to the first driver chip C1 due to an external impact applied in a direction from the display panel 520 toward the bottom portion 581 of the receiving member 580-1, and the heat dissipation member HM may be used to improve an effect of releasing heat generated from the first driver chip C1 to outside the display device 804.

According to one or more exemplary embodiment of a display device according to the invention, even when external force is applied to a display device, direct application of an impact to a driver chip of a drive unit due to the external force may be reduced or effectively prevented. Accordingly, since the impact is not directly applied to the driver chip, damage to the driver chip by the impact is reduced or effectively prevented, so that reliability associated with an operation of the display device may be improved.

While the disclosure has been particularly shown and described with reference to exemplary embodiments thereof, those skilled in the art would understand that various changes in form and details may be made therein without departing from the spirit and scope of the disclosure as defined by the appended claims. Therefore, it is intended that the present disclosure not be limited to the exact forms and details described and illustrated, but fall within the scope of the appended claims.

What is claimed is:

1. A display device comprising:
   a display panel which displays an image on a front side of the display panel, the display panel comprising a pad portion on the front side;
   a drive circuit board which generates a drive signal to drive the display panel and is disposed on a reverse side of the display panel;
   a drive circuit film which is electrically connected to the pad portion and bendable to electrically connect the display panel and the drive circuit board on the reverse side of the display panel to each other; and
   a driver chip which is mounted on the drive circuit film, wherein
   the drive circuit board which is on the reverse side of the display panel and electrically connected to the drive circuit film defines a receiving hole of the drive circuit board in which the driver chip is disposed, and
   the drive circuit film which is bent and electrically connected to the drive circuit board on the reverse side of the display panel disposes the driver chip in the receiving hole and between the drive circuit film and the display panel in a cross-sectional view.

2. The display device of claim 1, wherein a side of the drive circuit board on the reverse side of the display panel and electrically connected to the drive circuit film is open in a direction facing the drive circuit film to expose the receiving hole to the driver chip.

3. The display device of claim 1, wherein the receiving hole defined in the drive circuit board is provided in plurality each corresponding to the pad portion of the display panel.

4. The display device of claim 1, wherein
   the drive circuit board comprises:
      a base portion from which are protruded a plurality of dummy portions spaced apart from each other, and
      the receiving hole defined in the drive circuit board and in which the driver chip is disposed is provided between dummy portions adjacent to each other, and
   each of the plurality of dummy portions spaced apart from each other corresponds to the pad portion of the display panel.

5. The display device of claim 1, wherein
   the drive circuit board defines:
      a base portion thereof; and
      a dummy portion thereof which extends from a side of the base portion and defines the receiving hole of the drive circuit board, and
   the drive circuit film bent to extend from the display panel toward the drive circuit board extends through the receiving hole defined by the dummy portion.

6. The display device of claim 5, wherein the dummy portion of the drive circuit board overlaps the pad portion of the display panel in a top plan view.

7. The display device of claim 6, wherein the dummy portion of the drive circuit board is provided in plurality and the plurality of the dummy portions is arranged in a length direction of the pad portion of the display panel in the top plan view.

8. The display device of claim 1, wherein
   the drive circuit film which is bent and electrically connected to the drive circuit board on the reverse side of the display panel, extends along a first direction from the pad portion,
   the drive circuit board which is on the reverse side of the display panel and electrically connected to the drive circuit film which is bent, defines the receiving hole to be open along the first direction.

9. The display device of claim 8, wherein a same one of the receiving hole which is open along the first direction, is further open in a direction away from the display panel.

10. The display device of claim 8,
    the driver chip is provided in plurality on the drive circuit film arranged along a second direction crossing the first direction in which the drive circuit film extends from the pad portion,
    the drive circuit board which is on the reverse side of the display panel and electrically connected to the drive circuit film which is bent, defines the receiving hole in plurality arranged along the second direction and respectively corresponding to the driver chip which is provided in plurality.

11. The display device of claim 1, wherein the drive circuit film which is bent and electrically connected to the drive circuit board on the reverse side of the display panel, extends across the receiving hole to dispose the drive circuit film located at the driver chip, outside of the receiving hole.

12. A display device comprising:
    a display panel which displays an image with light to a front side of the display panel; a receiving member which receives the display panel therein, the receiving member including a bottom portion and a side wall which extends from the bottom portion;
    a drive circuit board which generates a drive signal to drive the display panel and is disposed on a back surface of the bottom portion of the receiving member to overlap the display panel at a reverse side of the display panel;
    a drive circuit film which is bendable to electrically connect the display panel and the drive circuit board to each other; and
    a driver chip which is on the drive circuit film and provides a control signal in response to the drive signal from the drive circuit board, wherein
    the drive circuit board which is on the back surface of the bottom portion and electrically connected to the drive circuit film defines a receiving hole of the drive circuit board in which the driver chip is disposed, the receiving hole defined through an entire thickness of the drive circuit board, and
    the drive circuit film which is bent and electrically connected to the drive circuit board on the back surface of the bottom portion disposes the driver chip in the receiving hole to be between the driver circuit film and the back surface of the bottom portion, and spaced apart from the back surface of the bottom portion at the receiving hole.

13. The display device of claim 12, further comprising a heat dissipation member disposed on the driver chip disposed in the receiving hole and contacting the driver chip, wherein the heat dissipation member in contact with the driver chip disposed in the receiving hole faces the bottom portion of the receiving member with an air layer in-between.

14. The display device of claim 12, further comprising a buffer member which is disposed on the bottom portion of the receiving member and adjacent to the driver chip disposed in the receiving hole, wherein the buffer member extends from the bottom portion of the receiving member further than the driver chip.

15. The display device of claim 12, further comprising a backlight unit which is disposed in the receiving member, and generates the light and emits the light toward the display panel.

16. A display device comprising:
a display panel which displays an image with light;
a receiving member which receives the display panel therein, the receiving member comprising:
a bottom portion which defines a back surface of the receiving member, and
a side wall extending from the bottom portion;
a drive circuit board which generates a drive signal to drive the display panel, the drive circuit board on the back surface of the receiving member;
a drive circuit film which electrically connects the display panel to the drive circuit board to each other and is bent from the display panel toward the drive circuit board; and
a driver chip which is on the drive circuit film and provides a control signal in response to the drive signal from the drive circuit board, and
wherein
the bottom portion of the receiving member comprises two protruded portions each bent from the bottom portion in a direction away from the display panel to be spaced apart from each other in a direction along the bottom portion,
the drive circuit film extends across the two protruded portions of the bottom portion to dispose the driver chip between the two protruded portions, and
a height of each protruded portion among the two protruded portions of the bottom portion is greater than a thickness of the driver chip disposed between the two protruded portions.

17. The display device of claim 16, wherein each of the two protruded portions of the receiving member is spaced apart from the driver chip in the direction along the bottom portion.

18. The display device of claim 16, further comprising a heat dissipation member disposed on the driver chip disposed between the two protruded portions and contacting the driver chip, wherein the heat dissipation member in contact with the driver chip disposed between the two protruded portions the bottom portion with an air layer in-between.

19. The display device of claim 16, further comprising a backlight unit which is disposed in the receiving member, and generates and emits the light toward the display panel.

* * * * *